United States Patent [19]

Nguyen et al.

[11] Patent Number: 5,689,227

[45] Date of Patent: Nov. 18, 1997

[54] CIRCUIT BOARD MATERIAL WITH BARRIER LAYER

[75] Inventors: Phong Xuan Nguyen, Encino; Steven Russell Nissen, Culver City, both of Calif.

[73] Assignee: Ohmega Electronics, Inc., Culver City, Calif.

[21] Appl. No.: 587,490

[22] Filed: Jan. 17, 1996

Related U.S. Application Data

[63] Continuation of Ser. No. 94,778, Jul. 21, 1993, abandoned.

[51] Int. Cl.[6] .......... H01C 1/012; H01C 1/142; H01C 1/14; B32B 3/00

[52] U.S. Cl. .......... 338/308; 338/309; 338/314; 338/327; 338/328; 252/513; 252/518; 428/667; 428/209; 428/901

[58] Field of Search .......... 338/308, 309, 338/314, 327, 328; 428/209, 901, 677; 252/513, 518

[56] References Cited

U.S. PATENT DOCUMENTS

| | | | |
|---|---|---|---|
| 2,662,957 | 12/1953 | Eisler | 201/73 |
| 3,808,576 | 4/1974 | Castonguay et al. | 338/309 |
| 4,220,945 | 9/1980 | Kabuhashi et al. | 338/308 |
| 4,503,112 | 3/1985 | Konicek | 428/216 |
| 4,808,967 | 2/1989 | Rice et al. | 338/309 |
| 4,888,574 | 12/1989 | Rice et al. | 338/309 |
| 4,892,776 | 1/1990 | Rice | 428/209 |

*Primary Examiner*—Cathy F. Lam
*Attorney, Agent, or Firm*—Jeffer, Mangels, Butler & Marmaro LLP

[57] ABSTRACT

A circuit board material is disclosed which includes a support layer, at least one electrical resistance layer having a preselected resistivity adhered to the support layer, a barrier layer adhered to the electrical resistance layer, and a conductive layer adhered to the barrier layer. The barrier layer is capable of protecting the resistance layer from attack by alkaline ammoniacal copper etchants. A method of producing the circuit board material is also disclosed.

12 Claims, 1 Drawing Sheet

CIRCUIT BOARD MATERIAL WITH BARRIER LAYER

This application is a continuation of application Ser. No. 08/094,778, filed Jul. 21, 1993, now abandoned.

FIELD OF THE INVENTION

The present invention relates to an improved circuit board material having an electrical resistance layer.

BACKGROUND OF THE INVENTION

Circuit board materials which include an electrical resistance layer are known. Such materials are disclosed, for example, in U.S. Pat. No. 4,892,776 and the references cited therein. These materials typically include a support layer, at least one electrical resistance layer, such as a nickel alloy, and a conductive layer, such as copper, adhered to the resistance layer. Known materials have proven satisfactory in some applications. However, it would be desirable to provide materials having improved chemical, thermal and mechanical properties, such as higher electrical resistance values, temperature resistance and load life.

A particular problem with known circuit board materials including an electrical resistance layer is inadequate etchant selectivity. In producing electrical circuits from these circuit board materials, an etchant is needed which can selectively etch copper, without reacting with the electrical resistance layer, thus providing resistors at design values and acceptable resistances within the desired tolerances. Known etchants which have the desired selectivity, such as chromesulfuric etchants, are also environmentally hostile. Other safer, commercially available etchants, such as alkaline ammoniacal copper etchants, are prone to react with the electrical resistance material to some degree. This makes it more difficult to obtain resistors with the target nominal resistance values and controllable tolerances. For example, use of alkaline ammoniacal copper etchant to etch circuit board materials which include electrical resistance layers requires very precise control of process parameters and equipment. This requirement for extreme precision results in increased production costs.

It would thus be desirable to provide a circuit board material which displays improved etchant selectivity, such that conventional alkaline ammoniacal etchants can be used to selectively etch the conductive layer without affecting the electrical resistance layer. Such an improved circuit board material would facilitate production of electrical circuit boards without the need for extremely precise control of process parameters.

It would also be desirable to provide a method of producing electrical circuit boards utilizing the improved circuit board material.

SUMMARY OF THE INVENTION

In accordance with one aspect of the present invention, there has been provided a circuit board material comprising a support layer; an electrical resistance layer having a preselected resistivity adhered to the support layer; a barrier layer adhered to the electrical resistance layer, wherein the barrier layer is capable of protecting the resistance layer from attack by alkaline ammoniacal etchants; and a conductive layer adhered to the barrier layer.

In a more specific aspect of the present invention, the inventive barrier layer is comprised of a material selected from the group consisting of Ni—Sn, Co—Sn, Cd—Sn, Cd—Ni, Ni—Cr, Ni—Au, Ni—Pd, Ni—Zn, Sn—Pb, Sn—Zn, Ni and Sn. Preferably the selected material is Ni—Sn. In a preferred embodiment, the thickness of the barrier layer is less than about 0.1 μm, particularly between about 50 Å and 0.1 μm.

According to another aspect of the present invention, there has been provided a process for producing an electrical circuit which includes the steps of coating the conductive layer surface of a circuit board material as described above with a first photoresist layer; imagewise exposing the photoresist layer to produce a combined conductor and resistor pattern; developing the pattern; removing exposed conductive layer; etching the circuit board material with a second etchant capable of stripping away barrier layer exposed during the previous etching step, and also removing resistance layer underlying the exposed barrier layer; stripping the remainder of the first photoresist layer; coating the etched circuit board material with a second photoresist layer (which can include the same or a different photoresist); imagewise exposing the second photoresist layer to produce a conductor pattern; developing the conductor pattern; removing exposed conductive layer by etching the circuit board material with an alkaline ammoniacal etchant; and stripping the remainder of the second photoresist layer.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The invention may be more readily understood by referring to the accompanying drawings in which.

DETAILED DESCRIPTION OF PREFERRED EMBODIMENTS

Figure 1:
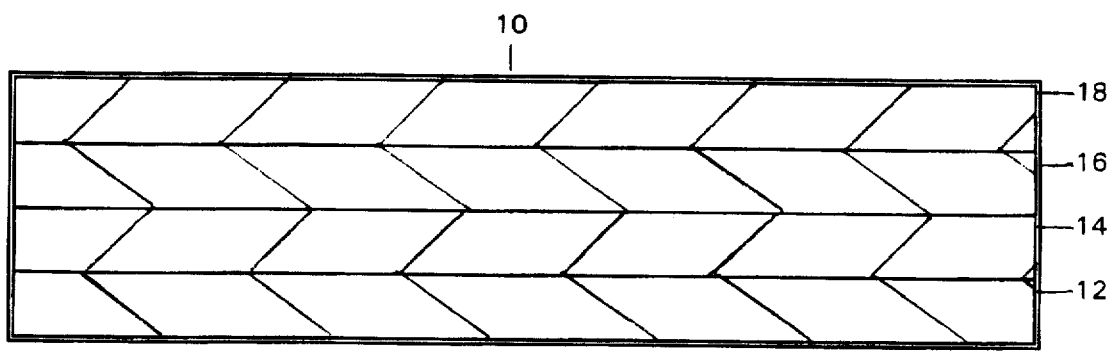
FIG. 1 is a cross-sectional view of a circuit board material according to the invention, showing the arrangement of the support, electrical resistance layer, barrier layer and conductive layer.

The barrier layer of the inventive circuit board material protects the underlying electrical resistance layer from alkaline ammoniacal etchant. Preferably, the barrier layer is also etchable or strippable in the same solution used to strip the resistance layer. For example, barrier layers which protect an underlying Ni—P resistance layer should be etchable or strippable in 1M copper sulfate solutions currently used to strip the Ni—P resistive material. Desirably, such stripping should be accomplished within about 15 minutes using a 1M copper sulfate solution at 90° C. However, barrier layers requiring longer stripping times can also be used to advantage in some applications.

The barrier layer can be an inorganic material which has good etchant selectivity. It is also important that the material used as the barrier layer have no substantial detrimental effect on the uniformity of the resistivity and other functional properties of the underlying electrical resistance layer. Preferably, the nominal value of the resistivity also is not detrimentally affected.

Suitable materials which can be used in the inventive barrier layer include inorganic materials such as Ni—Sn, Co—Sn, Cd—Sn, Cd—Ni, Ni—Cr, Ni—Au, Ni—Pd, Ni—Zn, Sn—Pb, Sn—Zn, Ni and Sn. Particularly preferably the barrier layer is a layer of Ni—Sn alloy.

Care must be taken so that the barrier layer is not excessively thick. Layers thicker than about 0.1 μm begin to act as conductors; that is, they display sufficiently low resistivity, and thus high conductivity, to adversely affect the uniformity of the resistivity of the underlying resistance layer, as well as its nominal value. Preferably, the thickness of such barrier layers is between about 50 Å and 0.1 μm, very preferably between about 150 Å and 600 Å.

The inventive barrier layer should also be producible consistently and uniformly over the entire surface area of the conductive layer. This can be accomplished, for example, by using conventional electroplating techniques.

The following electroplating baths are especially suitable for depositing inorganic barrier layers within the present invention (all concentrations in g/l):

1) Nickel-Tin baths
   (a) Pyrophosphate
   Stannous chloride ($SnCl_2.2H_2O$) 28 g/l
   Nickel chloride ($NiCl_2.6H_2O$) 31
   Potassium pyrophosphate
   ($K_4P_2O_7.3H_2O$) 192
   Glycine 20
   Operating Temperature 40°–60° C.
   pH 7.5–8.5
   Current Density 0.05–0.5 A/dm$^2$
   (b) Fluoride
   Stannous chloride anhydrous
   ($SnCl_2$) 50 g/l
   Nickel chloride ($NiCl_2.6H_2O$) 300
   Ammonium bifluoride ($NH_4HF_2$) 56
   Operating Temperature 45°–75° C.
   pH 2–2.5
   Current Density 0.02–0.3 A/dm$^2$
   (c) Hydrochloric
   Stannous chloride ($SnCl_2.2H_2O$) 30 g/l
   Nickel chloride ($NiCl_2.6H_2O$) 300
   Hydrochloric acid (HCl) 5–25 vol %
   Operating Temperature 40°–70° C.
   pH 0.2–0.5
   Current Density 0.05–0.5 A/dm$^2$ 2) Cobalt-Tin bath
   Stannous pyrophosphate
   ($Sn_2P_2O_7$) 20 g/l
   Cobalt chloride ($CoCl_2.6H_2O$) 50
   Potassium pyrophosphate
   ($K_4P_2O_7.3H_2O$) 250
   Operating Temperature 50°–70° C.
   pH 9.5–9.9
   Current Density 0.05–0.5 A/dm$^2$ 3) Cadmium - Tin bath
   Stannous Sulfate ($SnSO_4$) 15 g/l
   Cadmium Sulfate ($3CdSO_4.8H_2O$) 70
   Sulfuric Acid ($H_2SO_4$) 50
   Polyvinyl Alcohol 1
   Pentaerythritol 1
   Operating Temperature 15°–30° C.
   pH<1
   Current Density 0.05–0.2 A/dm$^2$ 4) Cadmium - Nickel bath
   Nickel Sulfate ($NiSO_4.7H_2O$) 114 g/l
   Cadmium Sulfate
   ($3CdSO_4.8H_2O$) 10
   Boric Acid ($H_3BO_3$) 10
   Operating Temperature 35°–70° C.
   pH 2–3
   Current Density 0.01–0.1 A/dm$^2$ 5) Nickel - Chromium bath
   (a) Formate
   Nickel Formate ($Ni(HCOO)_2.2H_2O$) 90 g/l
   Potassium Chromium
   Sulfate ($KCr(SO_4)_2.12H_2O$) 430
   Sodium Citrate
   ($Na_3C_6H_5O_7.2H_2O$) 75
   Boric Acid ($H_3BO_3$) 40
   Sodium fluoride (NaF) 10
   Glycine 20
   Operating Temperature 30°–35° C.
   pH 2–2.2
   Current Density 0.05–0.5 A/dm$^2$
   (b) Fluoborate Bath
   Nickel Fluoborate ($Ni(BF_4)_2$) 30 g/l
   Chromium Fluoborate ($Cr(BF_4)_3$) 50
   Fluoboric Acid ($HBF_4$) 300
   Operating Temperature 20°–70° C.
   pH 1–3
   Current Density 0.05–1 A/dm$^2$ 6) Nickel-Gold bath
   Potassium Gold Cyanide ($KAu(CN)_2$) 6 g/L
   Potassium Nickel Cyanide ($K_2Ni(CN)_4$) 8
   Potassium Cyanide (KCN) 16
   Temperature: 60°–80° C.
   Current Density 0.05–0.2 amp/dm$^2$ 7) Nickel-Palladium bath
   P-Salt ($Pd(NH_3)_2(NO_2)_2$) 6 g/L
   Nickel Sulfamate ($Ni(SO_3NH_2)_2$) 32
   Ammonium Sulfamate ($NH_4(SO_3NH_2)$) 90
   Ammonium Hydroxide to pH 8–9
   Temperature: 20°–40° C.
   Current Density 0.05–0.1 amp/dm$^2$ 8) Nickel-Zinc bath
   Nickel Chloride ($NiCl_2.6H_2O$) 300 g/L
   Zinc Chloride ($ZnCl_2$) 155
   pH 2–3
   Temperature 70°–80° C.
   Current Density 0.05–0.5 amp/dm$^2$ 9) Tin-Lead bath
   Stannous Fluoborate ($Sn(BF_4)_2$) 108 g/L
   Lead Fluoborate ($Pb(BF_4)_2$) 70
   Fluoboric Acid ($HBF_4$) 400
   Boric Acid ($H_3BO_3$) 26
   Peptone 5
   Temperature 15°–25° C.
   Current Density 0.5–2.0 amp/dm$^2$ 10) Tin-Zinc bath
    Stannous Pyrophosphate ($Sn_2P_2O_7$) 20 g/L
    Zinc Pyrophosphate ($Zn_2P_2O_7$) 39
    Sodium Pyrophosphate ($Na_4P_2O_7$) 268
    Gelatin 1
    Temperature 50°–70° C.
    pH 8.5–9.5
    Current Density 0.05–0.5 amp/dm$^2$ 11) Nickel bath
    Nickel Chloride ($NiCl_2.6H_2O$) 300 g/l
    Boric Acid ($H_3BO_3$) 37.5
    Butynediol 1
    Operating Temperature 40°–60° C.
    pH 1.5–2.5
    Current Density 0.05–1.0 A/dm$^2$ 12) Tin bath
    Potassium Stannate
    ($K_2SnO_3.3H_2O$) 100 g/l Potassium Hydroxide (KOH) 15
Operating Temperature 60°–85° C.
pH 10–11.8
Current Density 0.05–1 A/dm$^2$ Use of the foregoing plating baths allows precise deposition of barrier layers of the invention in thicknesses which will provide sufficient resistance to ammoniacal alkaline etchant. The barrier layers so deposited furthermore are strippable in 1M copper sulfate solution typically used for stripping electrical resistance materials. Ni—Sn barrier layers of the invention produced using the pyrophosphate bath 1(a) are especially preferred.

Materials suitable for use as the conductive layer are known to those skilled in the art. The preferred material for use as the conductive layer is copper or a copper alloy.

Materials suitable for use as the electrical resistance layer are also well known, and include Ni—P and Ni—Cr alloys. The preferred material is a Ni—P alloy.

Similarly, materials suitable for use as the support layer are known to those skilled in the art. The support layer should be generally non-conducting. Exemplary of suitable material for use as the support layer are organic polymeric materials, reinforced epoxies and the like.

Exemplary conventional copper etchants useful with the present invention include alkaline ammoniacal cupric chloride, chrome-sulfuric, ammonium persulfate, hydrochloric cupric chloride and hydrochloric ferric chloride. The preferred conventional copper etchant is alkaline ammoniacal cupric chloride.

Typical operating conditions in etching processes using alkaline ammoniacal copper etchants are given below:

Temperature 48°–57° C.
pH 7.6–8.2
Spray Pressure 110–150 kPa
Copper Loading 112–142 g/l
Chloride 4.0–5.0M Referring now to the drawing, in FIG. 1 circuit board material 10 includes a conventional support layer 12, which can be a ceramic or polymeric substrate. Electrical resistance layer 14 is adhered to support layer 12. In the figure, one electrical resistance layer is depicted. However, a plurality of electrical resistance layers of differing composition can be present if desired. Barrier layer 16 is adhered to electrical layer 14 (or to the top electrical resistance layer if more than one such layer is used). Conductive layer 18 is adhered to barrier layer 16.

The present invention is further illustrated by the following non-limiting examples.

Ex. 1: Production of Circuit Board with Ni—Sn Barrier Layer

Circuit board materials were produced according to the following method. A batch process was employed with the plating cell remaining constant. Mild agitation was provided in the plating cell by a recirculating pump to maintain uniform bath composition. The cathode employed was electro-deposited one ounce copper foil plated on the matte side. The shiny or drum side of the foil was masked by a rubber coated backing fixture. The cathode size was 0.9 dm×1.25 dm. The anode was platinum clad columbium with an anode to cathode ratio of 1.3:1. Prior to passing into the plating cell, the copper foil was immersed in an aqueous sulfuric acid solution (20% by volume) for 30 sec.

A plating bath according to 1(a) was formed and used to plate a Ni—Sn barrier layer on the copper foil prepared above. Subsequently a nickel phosphoric/phosphorus bath was prepared in accordance with U.S. Pat. No. 4,888,574, which is incorporated in its entirety herein by reference. The bath had the following composition:

Nickel carbonate (NiCO$_3$) 106 g/l
Phosphorous acid (H$_3$PO$_3$) 164
Phosphoric acid (H$_3$PO$_4$) 25
Operating Temperature 70° C.,
pH 1.8

The bilayer copper foil was then plated in the foregoing bath to produce the resistance layer.

After plating the Ni—P electrical resistance material on the bilayer copper foil sample, the resistance layer was given an oxidizing treatment as commonly practiced in the art. Next, the resistance material was laminated to an epoxy fiberglass support layer, with the oxidized surface of the resistance layer in intimate contact with the support. Following lamination, the copper surface was coated with a photoresist material, which was then exposed through a photographic negative containing the combined conductor and resistor patterns. The exposed photoresist was developed, leaving the composite resistor-conductor pattern protected. The exposed copper was then etched with an alkaline ammoniacal cupric chloride etchant and rinsed in water, then immersed in a selective 1M copper sulfate solution until both the exposed barrier layer and the underlying resistance layer were removed. The 1M copper sulfate solution was at 90° C. and consisted of 250 g/l of copper sulfate and 2 ml/l of concentrated sulfuric acid.

The remaining photoresist was next stripped away, and the panel was again coated with a photoresist and exposed to protect the conductor pattern. The exposed photoresist was etched in alkaline ammoniacal cupric chloride etchant to remove the bare copper. The panel was rinsed, and the remaining photoresist was then stripped away, after which the panel was again rinsed and dried. At this point, the conductive and resistive elements were defined and in electrical contact with each other.

Ex. 2: Ni—Sn barrier layer

A trilayer copper foil was produced including a Ni—Sn barrier layer and a Ni—P electrical resistance layer. The respective layers were produced using the appropriate bath described in Ex. 1 above. The copper foil was plated in the nickel phosphoric/phosphorous bath of Ex. 1 for 30 sec at 3 amp/dm$^2$ (Table 1) or 5 amp/dm$^2$ (Table 2) to produce resistance layers.

Composition analysis of the Ni—Sn deposit by Auger spectroscopy showed a 50:50 atomic ratio or 65:35 weight ratio of Sn to Ni.

The effects of the Ni—Sn barrier layer on the sheet resistivity and chemical resistance of the electrical resistance layer of circuit board materials according to the invention (nominal 100 ohms/square and 25 ohms/square) are presented in Tables 1 and 2, respectively. Various thicknesses of the Ni—Sn barrier layer, shown in column 1, were electroplated on the copper substrate prior to depositing the Ni—P resistive film. The tri-layer metal foils were then pressed under heat and pressure with an epoxy/glass dielectric material to form a laminated printed circuit board material. The laminates were then processed into square resistor elements with the sheet resistance values shown in column 2. The resistance of the elements to ammoniacal alkaline copper etchant, as measured by the change in sheet resistivity after exposure of the elements to the etchant for a fixed period of time, is shown in columns 3 and 4. The values are for the resistance change after 60 and 120 seconds exposure, respectively. The time to strip the same resistor elements in copper sulfate and hydrochloric cupric chloride etchants are indicated in columns 5 and 6, respectively.

TABLE 1

| THICKNESS OF Ni—Sn BARRIER LAYER (Å) | SHEET RESISTANCE VALUE (OHMS/SQUARE) | % RESISTANCE CHANGE AFTER EXPOSURE TO ALKALINE AMMONIACAL COPPER ETCHANT (ΔR%) | | TIME TO STRIP RESISTANCE LAYER (min) | |
|---|---|---|---|---|---|
| | | 60 sec | 120 sec | IN 1M COPPER SULFATE SOLUTION | IN HYDROCHLORIC CUPRIC CHLORIDE COPPER ETCHANT |
| 0 | 102.3 | 21.7 | 37.9 | 2 | 0.75 |
| 165 | 93.3 | 1.9 | 3.6 | 3 | 1.05 |
| 370 | 76.4 | 1.9 | 3.3 | 6 | 1.25 |
| 460 | 68.8 | 1.6 | 3.0 | 17 | 2 |
| 660 | 48.4 | 1.5 | 2.4 | 32 | 4.5 |
| 880 | 38.2 | 1.0 | 1.7 | >45 | 9 |
| 1060 | 32.8 | 1.0 | 1.6 | >45 | 9 |

TABLE 2

| THICKNESS OF Ni—Sn BARRIER LAYER (Å) | SHEET RESISTANCE VALUE (OHMS/SQUARE) | % RESISTANCE CHANGE AFTER EXPOSURE TO ALKALINE AMMONIACAL COPPER ETCHANT (ΔR%) | | TIME TO STRIP RESISTANCE LAYER (min) | |
|---|---|---|---|---|---|
| | | 60 sec | 120 sec | IN 1M COPPER SULFATE SOLUTION | IN HYDROCHLORIC CUPRIC CHLORIDE COPPER ETCHANT |
| 0 | 23.5 | 5.2 | 9.1 | 6 | 6 |
| 165 | 22.3 | 0.8 | 1.5 | 7 | 6 |
| 370 | 22.0 | 0.8 | 1.6 | 9 | 6 |
| 460 | 20.4 | 0.8 | 1.5 | 19 | 7 |
| 660 | 17.9 | 0.8 | 1.3 | 34 | 10 |
| 880 | 15.2 | 0.9 | 1.7 | >45 | 12 |
| 1060 | 14.2 | 0.6 | 1.1 | >45 | 18 |

The data clearly showed that the thicker the Ni—Sn barrier layer is deposited above the Ni—P resistive film, the lower the combined sheet resistance value, and the more resistant the resistive material to various copper etchants. A very thin layer of about 160 Å (see line 2 of Table 2) can significantly improve the resistance of the resistive layer to the ammoniacal alkaline etchant and can be easily etched in the copper sulfate solution, especially in the 100 ohms/square material.

Ex. 3: Changes in Thermal and Mechanical Properties

The effect of a Ni—Sn barrier layer according to the invention on various commercially important thermal and mechanical properties of the resistive Ni—P materials were assessed. Samples having electrical resistance values of 25, 100 and 250 ohms/square were prepared without a barrier layer, as is known to the art, and with a barrier layer according to the invention.

Electrodeposited copper foils (35 µm thick, 2.9 dm×3.6 dm) were prepared in a manner similar to that of Ex. 1. The known samples having resistance values of 25 ohms/square and 100 ohms/square were plated with a Ni—P electrical resistance layer using a bath as disclosed in U.S. Pat. No. 4,888,574. The known material having a resistance value of 250 ohms/square was plated with a Ni—P electrical resistance layer using a bath as disclosed in U.S. Pat. No. 4,892,776. All of the inventive samples were first plated with a Ni—Sn barrier layer using a plating bath according to 1(a) above. The inventive 25 ohms/square material had a 400 Å thick Ni—Sn coating, the inventive 100 ohms/square a 500 Å thick coating, and the inventive 250 ohms/square a 370 Å thick coating. The inventive materials were then plated with a Ni—P electrical resistance layer using a bath as disclosed in U.S. Pat. No. 4,888,574.

The resistance values, the resistance tolerances (defined as three standard deviations over the mean value) and various thermal mechanical properties of the materials were measured and compared as indicated in Table 3. No deleterious effects were observed, while certain properties were significantly improved with the use of a barrier layer according to the invention.

TABLE 3

| SHEET RESISTIVITY (OHMS/SQUARE) | 25 (K)[1] | 25 (I) | 100 (K) | 100 (I) | 250[2] (K) | 250 (I) | REMARKS AND CONDITIONS |
|---|---|---|---|---|---|---|---|
| RESISTANCE TOLERANCE (%) | +/−5 | +/−3 | +/−5 | +/−3 | +/−10 | +/−6 | |
| RESISTANCE TEMPERATURE CHARACTERISTIC (RTC) (PPM/°C.) | −39.05 | 23.89 | −106.23 | −15.04 | 100.00 | 55.80 | MIL-STD-202-304 HOT CYCLE: 25°, 50°, 75°, 125° C. COLD CYCLE: 25°, 0°, −25°, −55° C. |
| HUMIDITY TEST (Δ R %) | 0.18 | −0.16 | 0.81 | 0.39 | 2.00 | 1.73 | MIL-STD-202-103 TEMP: 40° C. RH: 95% TIME: 240 HRS |
| SOLDER FLOAT (Δ R %) | −0.08 | 0.00 | −0.58 | −0.07 | 0.50 | −0.14 | MIL-STD-202-210 TEMP: 260° C. IMMERSION: 20 SEC |
| LOAD LIFE (Δ R %) | 0.72 | 0.68 | 1.36 | 1.37 | 2.00 | 1.69 (640 hr) | MIL-STD-202-1081 AMBIENT TEMP: 70° C. ON CYCLE: 1.5 HRS. OFF CYCLE: 0.5 HRS. TIME: 1200 HRS |

[1] K = known; I = invention
[2] Known 250 ohms/square is made using a high ohmic (hypophosphorous) bath as taught in U.S. Pat. No. 4,892,776, incorporated by reference; the inventive 250 ohms/square material is made using a bath as taught in U.S. Pat. No. 4,888,574.

Ex. 4: High-ohmic materials

Three high-ohmic materials (>250 ohms/square) were prepared to assess the effectiveness of barrier layers. In each case an electrical resistance layer was electrodeposited using a nickel hypophosphite bath prepared in accordance with U.S. Pat. No. 4,892,776. The bath had the following composition:

Nickel carbonate ($NiCO_3$) 29.7 g/l
Hypophosphorous acid ($H_3PO_2$) 46.2
Operating Temperature 40° C.
pH 3.5

Copper foil sample A (0.9 dm×1.25 dm) was activated by immersion in an aqueous solution of 500 ppm benzotriazole at 60° C. for 30 sec. The sample was then plated in the hypophosphite bath for 30 sec at 0.77 amp/dm$^2$ to produce the resistance layer (800 Å thick). No barrier layer was provided between the copper foil and the resistance layer.

Copper foil sample B was provided with a tin barrier layer (160 Å thick) before deposition of the electrical resistance layer. The tin layer was deposited using a bath having the following composition (see bath 7, above):

Potassium Stannate ($K_2SnO_3 \cdot 3H_2O$) 100 g/l
Potassium Hydroxide (KOH) 15
Operating Temperature 60° C.
pH 11.8
Current Density 0.11 A/dm$^2$
Time 15 sec After the tin layer was deposited, the sample was electroplated in the hypophosphite bath for 30 sec at 0.4 amp/dm$^2$ to produce the electrical resistance layer (400 Å thick).

Copper foil sample C was provided with a nickel-tin barrier layer (220 Å thick) before deposition of the electrical resistance layer. The nickel-tin layer was deposited using a bath having the following composition (see bath 1(c), above):

Stannous chloride anhydrous ($SnCl_2 \cdot 2H_2O$) 30 g/l
Nickel chloride ($NiCl_2 \cdot 6H_2O$) 300
Hydrochloric acid (HCl) 20 vol %
Operating Temperature 65° C.
pH 0.35
Current Density 0.05 A/din$^2$
Time 30 sec After the nickel-tin layer was deposited, the sample was electroplated in the hypophosphite bath for 5 sec at 2.2 amp/dm$^2$ to produce the electrical resistance layer (360 Å thick).

For each sample, the sheet resistance, change in resistance after timed exposure to ammoniacal etchant, and time to remove the resistance layer by etching in 1M copper sulfate etchant were determined. Results are given in Table 4.

TABLE 4

| | Sheet Resistance ($10^3$ ohms/ square) | % Resistance Change Resistance after Exposure to Alkaline Ammoniacal Copper Etchant (ΔR%) | | Time to Strip Resistance Layer in 1M Copper Sulfate Etchant |
|---|---|---|---|---|
| Sample | | 70 sec | 140 sec | Solution (min) |
| A | 1.2 | 32 | *** | 1 |
| B | 1.2 | 20 | 39 | 10 |
| C | 1.3 | 16 | 42 | 2 |

***The resistance layer is completely etched off

As the data show, Samples B and C, having barrier layers, were substantially more stable, i.e., show less change in sheet resistance upon exposure to ammoniacal copper etchant, than Sample A, which did not have a barrier layer. Furthermore, among barrier layers, nickel-tin is particularly advantageous because it serves to protect the electrical resistance layer, yet is easily removed by etching in 1M copper sulfate solution.

What is claimed is:

1. A circuit board material comprising
   (a) a support layer;
   (b) an electrical resistance layer adhered to said support layer;
   (c) a barrier layer adhered to said electrical resistance layer, wherein said barrier layer has a thickness of less than about 0.1 μm, is different in composition from said resistance layer and is capable of protecting said resistance layer from attack by alkaline ammoniacal copper etchants;

and (d) a conductive layer adhered to said barrier layer.

2. A circuit board material as claimed in claim 1, wherein said barrier layer is comprised of a material selected from the group consisting of Ni—Sn, Co—Sn, Cd—Sn, Cd—Ni, Ni—Cr, Ni—Au, Ni—Pd, Ni—Zn, Sn—Pb, Sn—Zn, Ni and Sn.

3. A circuit board material as claimed in claim 2, wherein said barrier layer is comprised of Ni—Sn.

4. A circuit board material as claimed in claim 1, wherein said thickness is between about 100 Å and 0.1 µm.

5. A circuit board material as claimed in claim 4, wherein said thickness is between about 150 Å and 600 Å.

6. A circuit board material as claimed in claim 1, wherein said electrical resistance layer is comprised of a material selected from the group consisting of Ni—P and Ni—Cr.

7. A circuit board material as claimed in claim 6, wherein said electrical resistance layer is comprised of Ni—P.

8. A circuit board material as claimed in claim 1, wherein said conductive material is copper.

9. A circuit board material comprising (a) a support layer;

(b) a Ni—P electrical resistance layer adhered to said support layer;

(c) a Ni—Sn barrier layer having a thickness of less than about 0.1 µm adhered to said electrical resistance layer;

and (d) a copper conductive layer adhered to said barrier layer.

10. A circuit board material as claimed in claim 1, wherein said conductive layer is in intimate contact with said barrier layer.

11. A circuit board material as claimed in claim 1 wherein said barrier layer and said resistance layer have respective compositions comprising at least one element and said compositions differ in at least one element.

12. A circuit board material comprising (a) a support layer;

(b) an electrical resistance layer adhered to said support layer, wherein said resistance layer is comprised of a material selected from the group consisting of Ni—P and Ni—Cr;

(c) a barrier layer adhered to said electrical resistance layer, wherein said barrier layer has a thickness of less than about 0.1 µm, is comprised of a material selected from the group consisting of Ni—Sn, Co—Sn, Cd—Sn, Cd—Ni, Ni—Cr, Ni—Au, Ni—Pd, Ni—Zn, Sn—Pb, Sn—Zn, Ni and Sn, is different in composition from said resistance layer and is capable of protecting said resistance layer from attack by alkaline ammoniacal copper etchants;

and (d) a conductive layer adhered to said barrier layer.

* * * * *